(12) United States Patent  
Kuramochi

(10) Patent No.: US 8,058,562 B2
(45) Date of Patent: Nov. 15, 2011

(54) WIRING SUBSTRATE AND METHOD OF MANUFACTURING THE SAME

(75) Inventor: Toshiyuki Kuramochi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 502 days.

(21) Appl. No.: 12/337,965

(22) Filed: Dec. 18, 2008

(65) Prior Publication Data
US 2009/0159316 A1 Jun. 25, 2009

(30) Foreign Application Priority Data
Dec. 19, 2007 (JP) ................................. 2007-327499

(51) Int. Cl.
*H05K 1/00* (2006.01)

(52) U.S. Cl. ........ 174/255; 174/256; 174/258; 174/261; 174/262

(58) Field of Classification Search .................. None
See application file for complete search history.

(56) References Cited

U.S. PATENT DOCUMENTS

| | | | | |
|---|---|---|---|---|
| 6,329,603 B1* | 12/2001 | Japp et al. | | 174/255 |
| 6,869,665 B2* | 3/2005 | Tani et al. | | 428/209 |
| 6,871,396 B2* | 3/2005 | Sugaya et al. | | 29/860 |
| 7,035,081 B2* | 4/2006 | Nagata et al. | | 361/306.3 |
| 7,164,197 B2* | 1/2007 | Mao et al. | | 257/700 |
| 7,470,990 B2* | 12/2008 | Japp et al. | | 257/762 |
| 7,656,015 B2* | 2/2010 | Wong et al. | | 257/685 |
| 7,727,802 B2* | 6/2010 | Sunohara et al. | | 438/107 |
| 7,902,660 B1* | 3/2011 | Lee et al. | | 257/698 |
| 2006/0012967 A1* | 1/2006 | Asai et al. | | 361/764 |
| 2007/0085194 A1* | 4/2007 | Mao et al. | | 257/700 |
| 2009/0107705 A1* | 4/2009 | Cases et al. | | 174/255 |
| 2009/0302462 A1* | 12/2009 | Hosomi et al. | | 257/734 |

FOREIGN PATENT DOCUMENTS

JP 2000-261147 9/2000

* cited by examiner

*Primary Examiner* — Boris Chervinsky
(74) *Attorney, Agent, or Firm* — Drinker Biddle & Reath LLP

(57) ABSTRACT

A wiring substrate is provided. The wiring substrate includes: a core layer in which a gap is formed; and a lamination layer which includes an insulating layer and a wiring layer and which is formed on at least one surface of the core layer. The lamination layer has a thermal expansion coefficient different from that of the core layer. A plurality of mounting regions on which an electronic component is to be mounted are provided on the lamination layer to be spaced from each other. The gap in the core layer is filled with an insulating member having the same material as the insulating layer and surrounds each of the plurality of mounting regions or each of mounting region groups including one or more of the mounting regions.

9 Claims, 7 Drawing Sheets

WIRING SUBSTRATE AND METHOD OF MANUFACTURING THE SAME

This application claims priority from Japanese Patent Application No. 2007-327499, filed on Dec. 19, 2007, the entire contents of which are hereby incorporated by reference.

BACKGROUND

1. Technical Field

The present disclosure relates to a wiring substrate and a method of manufacturing the same. More particularly, the present disclosure relates to a wiring substrate having a multi-layer structure capable of preventing deformation or reducing a deformation amount, and a method of manufacturing the same.

2. Related Art

Recently, a high integration, an increase in number of pins, and a decrease in size of a semiconductor device have been promoted with an increase in performance and a decrease in size of an electronic device using the semiconductor device such as a semiconductor chip. As a substrate on which the multi-pin and miniaturized semiconductor device is mounted, a multi-layer wiring substrate using a build-up method is used.

In this kind of multi-layer wiring substrate, a core layer is a reinforcement member such as glass fabric copper-clad lamination, and an insulating layer and a wiring layer are alternatively formed on both surfaces of the core layer (see e.g., JP-A-2000-261147). FIG. 11 is a cross sectional view showing a schematic configuration of a multi-layer wiring substrate 110. As shown in the same drawing, the multi-layer wiring substrate 110 has a configuration in which an insulating layer 113 and a wiring layer 114 are layered on both surfaces of a core substrate 111 having a through-hole 112 formed therein. The wiring layer 114 formed on the upper and lower portions of the core substrate 111 are electrically connected to each other via the through-hole 112.

Incidentally, since the rigidity reduces due to a decrease in thickness of the multi-layer wiring substrate used as the mounting substrate, the elastic characteristics of the electronic component and the multi-layer wiring substrate are combined with each other when the electronic component such as the semiconductor device is mounted onto the mounting substrate. As a result, deformation is generated in the wiring substrate on which the electronic component is mounted.

Particularly, when deformation such as warpage is generated in the wiring substrate, the deformation may cause an error of a carrying operation or breakage of the substrate during an automatic substrate carrying operation of an electronic component mounting process in the facility. Since a semiconductor package has been required to be further decreased in size nowadays, an error is generated frequently with a decrease in thickness of the wiring substrate. For this reason, it is difficult to improve electric performance and to reduce package cost due to a decrease in thickness of the substrate.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a wiring substrate capable of preventing deformation such as warpage or remarkably reducing a deformation amount and a method of manufacturing the same. According to the wiring substrate, in an electronic component mounting process, errors caused by deformation can be prevented in a carrying operation and a mounting operation.

According to one or more aspects of the present invention, a wiring substrate is provided. The wiring substrate includes: a core layer in which a gap is formed; and a lamination layer which includes an insulating layer and a wiring layer and which is formed on at least one surface of the core layer. The lamination layer has a thermal expansion coefficient different from that of the core layer. A plurality of mounting regions on which an electronic component is to be mounted are provided on the lamination layer to be spaced from each other. The gap in the core layer is filled with an insulating member having the same material as the insulating layer and surrounds each of the plurality of mounting regions or each of mounting region groups including one or more of the mounting regions.

According to one or more aspects of the present invention, a groove portion is provided in the lamination layer to correspond to the insulating member.

According to one or more aspects of the present invention, at least one of a notch portion and a hole portion is formed through the insulating member and insulation layer.

According to one or more aspects of the present invention, the lamination layer is formed on both surfaces of the core layer.

According to one or more aspects of the present invention, the core layer is formed of prepreg material and the insulating layer is formed of resin material.

According to one or more aspects of the present invention, there is provided a semiconductor device including: the wiring substrate; and the electronic component mounted on the mounting regions.

According to one or more aspects of the present invention, in a method of manufacturing a wiring substrate, the method includes: (a) providing a core layer which includes: a plate member; through-vias formed in the plate member; and wiring patterns formed on the plate member and each connected to a corresponding one of the through-vias; (b) forming a gap in the core layer such that the gap surrounds each of the wiring patterns or each of wiring pattern groups including one or more of the wiring patterns; (c) disposing the core layer on an insulation-member having a thermal expansion coefficient different from that of the plate member; (d) forming an insulating layer so as to cover the core layer and fill the gap; and (e) forming a wiring layer on the insulating layer, thereby forming a lamination layer, which includes the insulating layer and the wiring layer, on the core layer.

According to one or more aspects of the present invention, the method further includes: (f) forming a groove portion in the lamination layer so as to correspond to a forming region of the gap.

According to one or more aspects of the present invention, the method further includes: (g) forming at least one of a notch portion and a hole portion so as to correspond to a forming region of the gap.

Other aspects and advantages of the present invention will be apparent from the following description, the drawings, and the claims.

DETAILED DESCRIPTION OF EXEMPLARY EMBODIMENTS OF THE INVENTION

Figure 1:
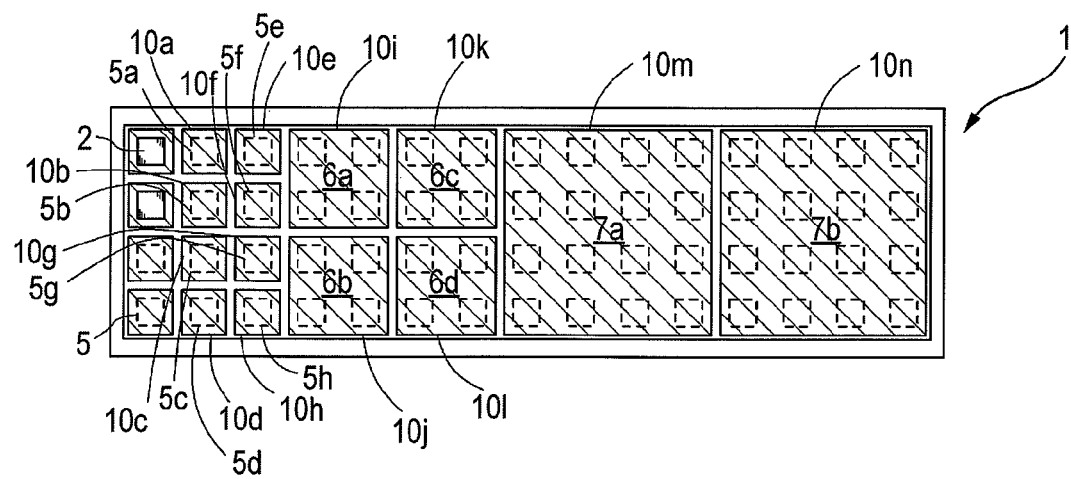
FIG. 1 is a schematic view showing a wiring substrate according to a first exemplary embodiment of the present invention.
Figure 2:
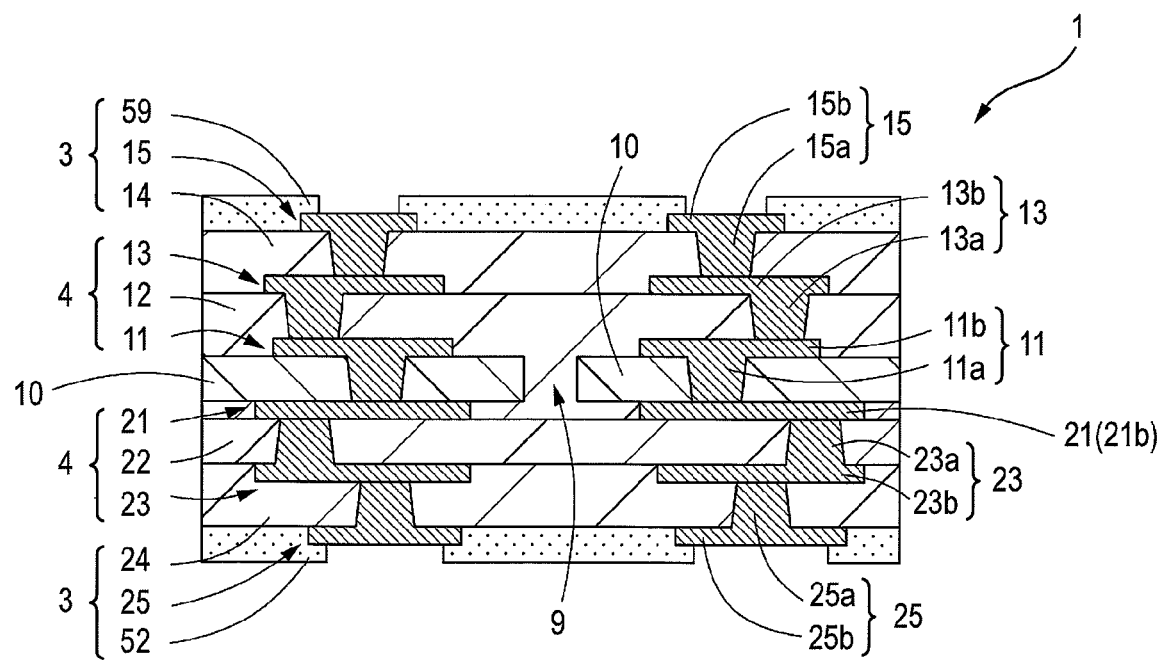
FIG. 2 is a cross sectional view (partially enlarged view) showing the wiring substrate shown in FIG. 1.
Figure 3:
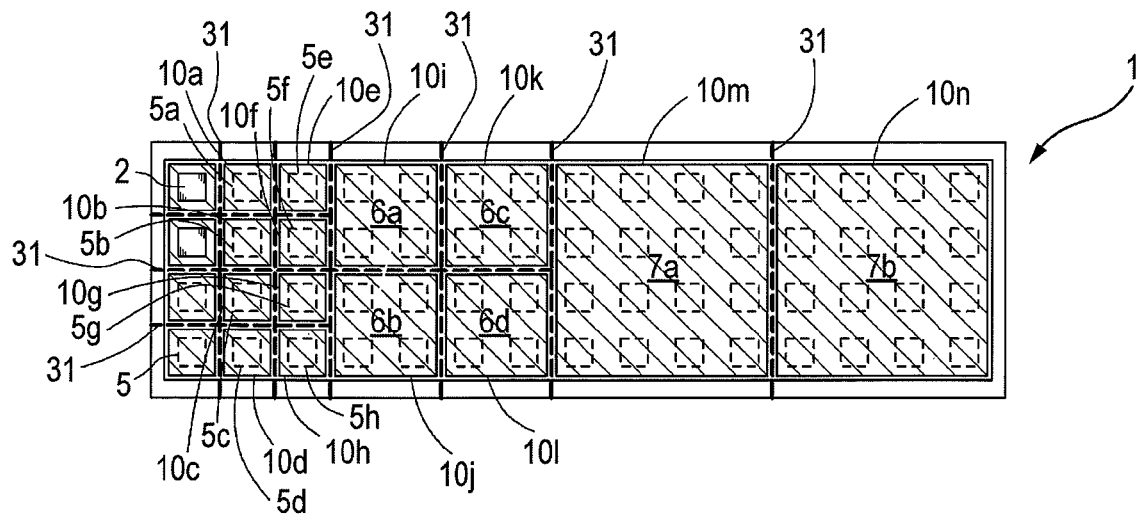
FIG. 3 is a schematic view showing a wiring substrate according to a second exemplary embodiment of the present invention.
Figure 4:
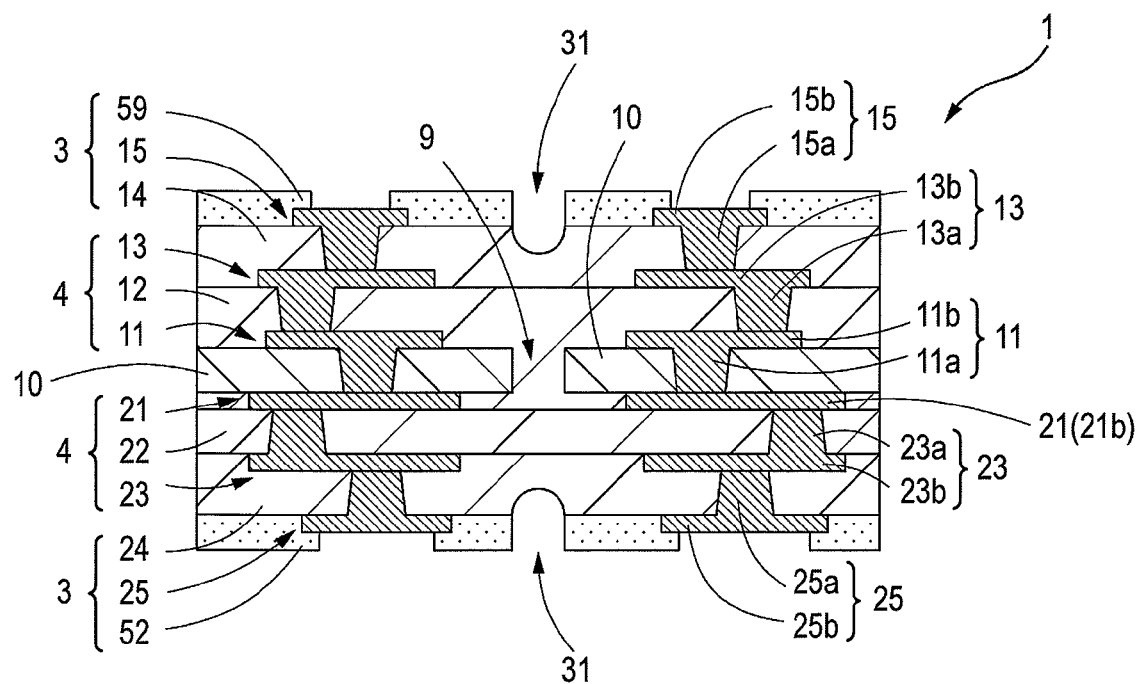
FIG. 4 is a cross sectional view (partially enlarged view) showing the wiring substrate shown in FIG. 3.
Figure 5:
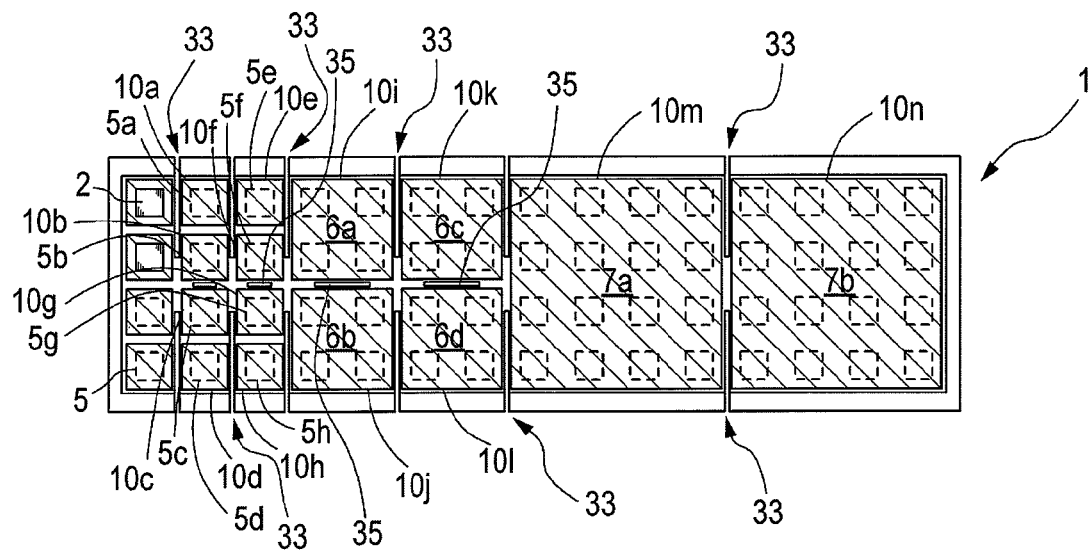
FIG. 5 is a schematic view showing a wiring substrate according to a third exemplary embodiment of the present invention.
Figure 6:
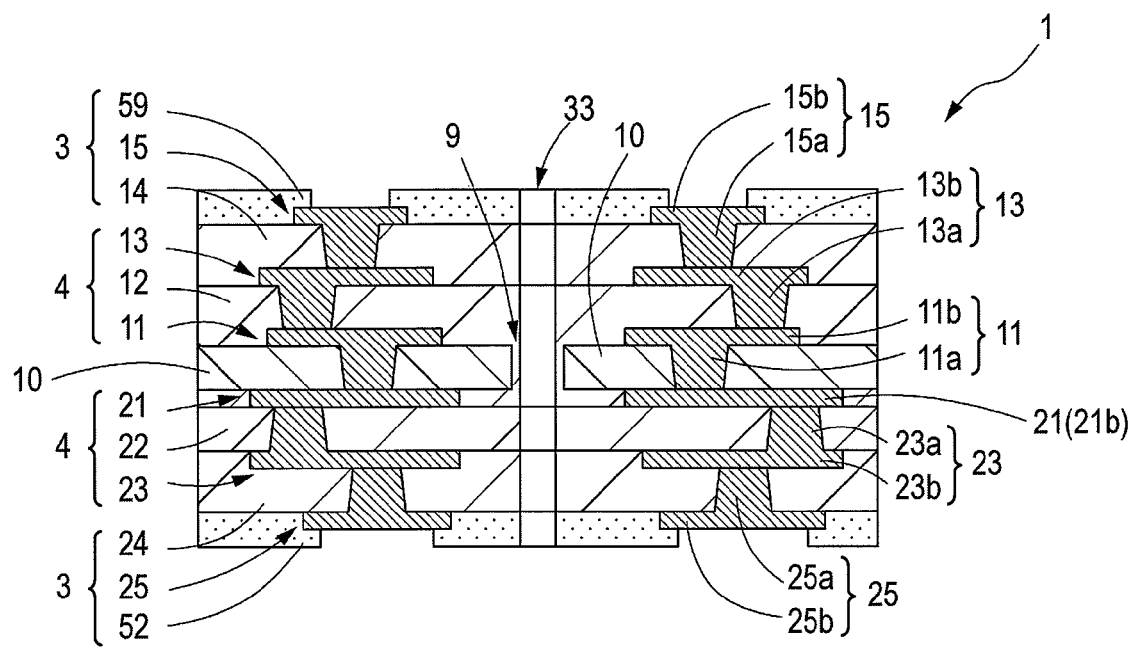
FIG. 6 is a cross sectional view (partially enlarged view) showing the wiring substrate shown in FIG. 5.
Figure 7:
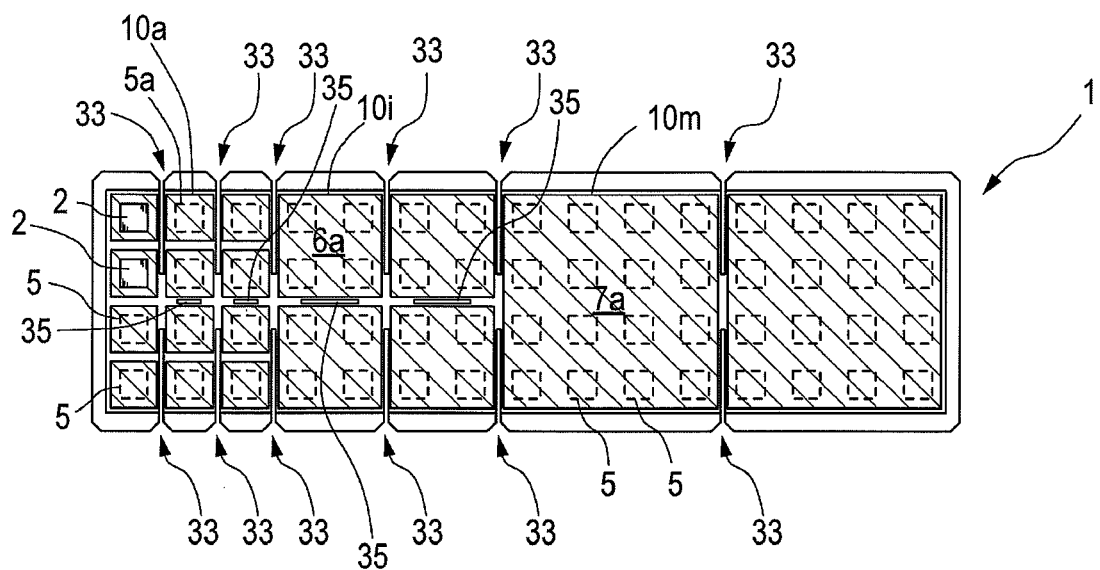
FIG. 7 is a schematic view (top view) showing a modified example of the wiring substrate shown in FIG. 5.

Hereinafter, exemplary embodiments of the present invention will be described in detail with reference to the accompanying drawings. FIG. 1 is a schematic view (top view) showing a wiring substrate 1 according to an exemplary embodiment of the invention. FIG. 2 is a cross sectional view (partially enlarged view in the vicinity of a gap 9) showing the wiring substrate 1 shown in FIG. 1. FIG. 3 is a schematic view (top view) showing the wiring substrate 1 according to a second exemplary embodiment of the invention. FIG. 4 is a cross sectional view (partially enlarged view in the vicinity of the gap 9) showing the wiring substrate 1 shown in FIG. 3. FIG. 5 is a schematic view showing the wiring substrate 1 according to a third exemplary embodiment of the invention. FIG. 6 is a cross sectional view partially enlarged view in the vicinity of the gap 9) showing the wiring substrate 1 shown in FIG. 5. FIG. 7 is a schematic view (top view) showing a modified example of the wiring substrate 1 shown in FIG. 5. FIGS. 8A to 8F are explanatory views illustrating a method of manufacturing the wiring substrate 1 particularly, a core layer 10) according to the exemplary embodiment of the invention. FIGS. 9A to 9E are explanatory views illustrating the method of manufacturing the wiring substrate 1 according to the exemplary embodiment of the invention. FIG. 10 is a schematic view showing the substrate 1 manufactured by the method. Additionally, regarding Reference Numerals in the drawings, Reference Numeral 5 wholly indicates Reference Numerals 5a, 5b, and so forth (the same applies to the other Reference Numerals).

The wiring substrate 1 is formed in such a manner that a surface layer 3 is laminated on the core layer 10. Here, the surface layer 3 is an insulating layer on which a wiring layer is laminated, which corresponds to a layer forming the surface of the wiring substrate 1. Additionally, solder resists 52 and 59 are coated at a certain position of the surface layer 3.

As for the wiring substrate 1 according to the exemplary embodiment of the invention, as shown in the cross sectional view (partially enlarged view) of FIG. 2, a multi-layer wiring substrate is exemplified in which an intermediate layer 4 and the surface layer 3 are laminated on both surfaces of the core layer 10. As in the surface layer 3, the intermediate layer 4 is an insulating layer on which the wiring layer is laminated. In this embodiment, one intermediate layer 4 is laminated on the upper and lower portions of the core layer 10, but if necessary, a plurality of intermediate layers 4 may be laminated on the upper and lower portions of the core layer 10.

Additionally, the wiring substrate 1 is not limited to the above-described configuration, but the intermediate layer 4 may not be provided or may be laminated on only one surface of the core layer 10.

More specifically, in the configuration of the wiring substrate 1, a wiring layer 11 is formed on an upper surface of the core layer 10, and an insulating layer 12 is formed on the wiring layer 11. Additionally, a wiring layer 13 is formed on the insulating layer 12. In the same manner, an insulating layer 14 is formed on the wiring layer 13, and a wiring layer 15 is formed on the insulating layer 14. Further, the solder resist 59 is coated at a certain position of the insulating layer 14 and the wiring layer 15.

Additionally, a wiring layer 21 is formed on a lower surface of the core layer 10, and an insulating layer 22 is formed on the wiring layer 21. Additionally, a wiring layer 23 is formed on the insulating layer 22. In the same manner, an insulating layer 24 is formed on the wiring layer 23, and a wiring layer 25 is formed on the insulating layer 24. Further, the solder resist 52 is coated at a certain position of the insulating layer 24 and the wiring layer 25.

Additionally, the term of "wiring layer" contains "via hole" connecting layers to each other and "a wiring pattern" formed in a certain shape. For example, the wiring layer 13 includes a via hole 13a and a wiring pattern 13b.

Here, material for forming each layer will be described.

First, as an exemplary material forming the core layer 10, prepreg material is used. The prepreg material is forming material in which fiber reinforcements such as carbon and glass are impregnated with thermosetting resin and which is characterized in that rigidity after the thermosetting treatment is larger than that of general buildup resin material.

Next, as an exemplary material forming the surface layer 3 and the intermediate layer 4, epoxy-based buildup resin material having thermosetting property is used.

Additionally, as an exemplary wiring layer forming the surface layer 3 and the intermediate layer 4, copper (Cu) is used as conductive material.

Likewise, since the core layer and the surface layer (or the surface layer and the intermediate layer) are respectively formed of materials having different heat expansion coefficients and the substrate needs to decrease in thickness, a problem may arise in that the manufactured wiring substrate 1 is deformed (particularly, is bent).

According to exemplary embodiment of the invention, as shown in the top view of FIG. 1, the core layer is divided for each electronic component mounting region or for each mounting region group including a plurality of mounting regions. Additionally, the top view of FIG. 1 is depicted in consideration of the convenience of description so as to understand a mutual position relationship of the constituents of the multilayer wiring substrate in a plane-perpendicular direction (a direction perpendicular to the surface of each layer).

As an example, in the drawing, the mounting region of an electronic component 2 is a square region denoted by Reference Numeral 5 and is shown as a dashed line. Accordingly, as a method of dividing the core layer, for example, each of the core layers 10a to 10h may be provided for a corresponding one of mounting regions 5a to 5h. (For example, the core layer 10a corresponds to the mounting region 5a.) Additionally, for example, each of core layers 10*i* to 10*l* may be provided for a corresponding one of mounting region groups 6*a* to 6*d*, each of which has four mounting regions. (For example, the core layer 10*i* corresponds to the mounting region group 6*a*.) Further, for example, the core layers 10*m* and 10*n* may be provided for a corresponding one of mounting region groups 7*a* and 7*b*, each of which has sixteen mounting regions.

As shown in the cross sectional view (partially enlarged view) of FIG. 2, the gap 9 is provided between one core layer and the other core layer which are adjacent to each other. In this embodiment, the gap 9 is filled with the forming material of the insulating layer 12. Here, the gap 9 does not completely divide the core layer, but the core layers divided for each of the plurality of mounting regions by the gap 9 are connected to each other at a certain position in terms of a connection portion (a core layer portion not divided by a dividing process described below). Additionally, a width (a gap between the adjacent core layers in an in-plane direction) of the gap 9 is not particularly limited, but is appropriately set in accordance with a thickness or the like of the wiring substrate 1.

As described above, since the filling portion formed of the insulating layer forming material having relatively lower rigidity than that of the core layer is provided between the adjacent core layers, it is possible to prevent the wiring substrate 1 from being bent in a typical convex shape or to remarkably reduce a deformation amount.

Additionally, in the wiring substrate 1 according to a second exemplary embodiment of the invention, as shown in the top view of FIG. 3, a groove portion 31 is provided in a whole surface or a partial surface of the surface layer 3 corresponding to a forming region of the gap 9 in a plane-perpendicular direction.

In this embodiment, the groove portion 31 is provided at the whole portion of the surface layer 3 corresponding to the forming region of the gap 9 in a plane-perpendicular direction (see FIG. 3), but may be provided at a certain position. Here, FIG. 3 is depicted in consideration of the convenience of the description, where the core layers having different sizes exist together.

Additionally, a width and a depth of the groove portion 31 are not particularly limited, but may be appropriately set in accordance with a thickness or the like of the wiring substrate 1. Further, a shape of the groove is not particularly limited, but may be various shapes such as U-shape and V-shape in accordance with the forming method thereof.

As shown in the cross sectional view (partially enlarged view) of FIG. 4, since the groove portion 31 is provided, it is possible to reduce a thickness of the substrate located at the portion of the gap 9. Accordingly, the rigidity of the insulating layer forming material filled in the gap 9 is further reduced than that of the configuration according to the first exemplary embodiment. For this reason, it is possible to further prevent the wiring substrate 1 from being bent in a convex shape or to remarkably prevent the deformation amount.

Additionally, in the wiring substrate 1 according to a third exemplary embodiment, as shown in the top view of FIG. 5, at least one of a notch portion 33 or a hole portion 35 is provided at a partial position of the wiring substrate 1 corresponding to the forming region of the gap 9 in a plane-perpendicular direction. Additionally, FIG. 5 is depicted in consideration of the description, where both the notch portion 33 and the hole portion 35 are provided.

In this embodiment, the notch portion 33 is provided at a partial position corresponding to the forming region of the gap 9 in a plane-perpendicular direction, and more specifically, the notch portion 33 is provided from an outer edge portion of the wiring substrate 1 up to a certain-length notch position. Additionally, the hole portion (through-hole) 35 may be provided at a certain position together with the notch portion 33 or instead of the notch portion 33. A shape of the hole portion 35 is not limited to the rectangular shape shown in FIG. 5, but the hole portion 35 may be formed into one or a plurality of round holes.

Additionally, a width and a length of the notch portion 33 and the hole portion 35 in an in-plane direction are not particularly limited, but may be appropriately set in accordance with a thickness or the like of the wiring substrate 1.

As shown in the cross sectional view (partially enlarged view) of FIG. 6, at a position where the notch portion 33 is provided, the adjacent core layers are separated from each other, thereby not allowing the wiring substrate to be in a deformed shape. On the other hand, at a position where the notch portion 33 is not provided, stress concentration is generated in the insulating layer forming material filled in the gap 9 between the adjacent core layers, and gravity is applied to the wiring substrate, thereby easily allowing the wiring substrate to be in a flat shape.

Accordingly, it is possible to further prevent the wiring substrate 1 from being bent in a convex shape or to more remarkably reduce the deformation amount than that of the configuration according to the second exemplary embodiment.

Meanwhile, according to a modified example shown in FIG. 7, since chamfering is performed to a notch start portion of the notch portion 33, it is possible to prevent the substrate from being caught by a carrier upon carrying the substrate and thus to prevent an error in a carrying operation. Additionally, it is more effective when four corners of the wiring substrate 1 are subjected to the chamfering.

Additionally, two or three of the groove portion, the notch portion, and the hole portion may be combined with each other.

Subsequently, a method of manufacturing the wiring substrate 1 according to the invention will be described with reference to FIGS. 8 to 10. Here, the wiring substrate 1 will be exemplified which has the multi-layer structure having a plurality of wiring layers and insulating layers laminated on both surfaces of the core layer 10. Additionally, the respective drawings of FIGS. 8 to 10 are cross sectional views of the substrate during each process.

Figure 8A:
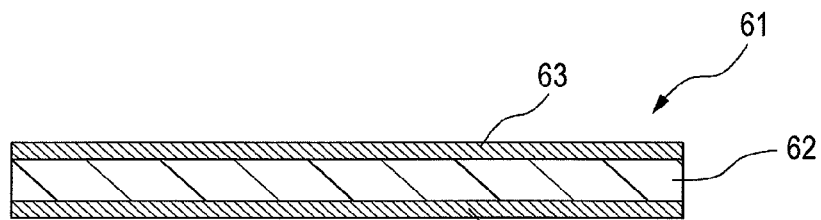
FIGS. 8A to 8F are explanatory views illustrating a method of manufacturing the wiring substrate according to the exemplary embodiment of the present invention.

In order to manufacture the wiring substrate 1, first, core material 61 having one sheet shape shown in FIG. 8A is prepared. The core material 61 has a configuration in which a copper foil 63 is provided on an upper surface of insulation material 62, and a copper foil 73 is provided on a lower surface thereof. As described above, the insulation material 62 is formed of prepreg material or the like.

A photoresist formed of photosensitive resin material is provided on the core material 61 by screen printing, photosensitive resin film laminating, or coating. Next, patterning is carried out by performing an exposure in such a manner that a beam is irradiated to the photoresist via a mask pattern (not shown), thereby forming an opening at a position where a via hole 11*a* described below is provided.

Figure 8B:
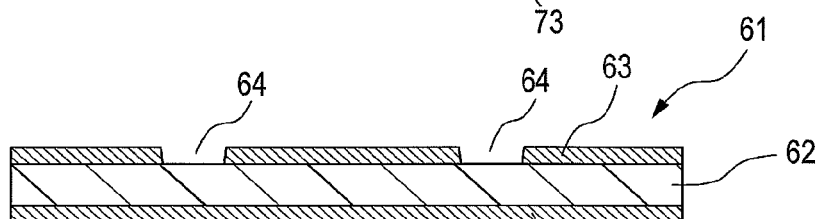

Then, an etching is performed to one surface of the copper foil (in this embodiment, the copper foil 63 formed on the upper surface) by using the patterned photoresist as a mask. Subsequently, when the photoresist is removed, as shown in FIG. 8B, a laser opening 64 is formed at a position where the via hole 11*a* is provided.

Figure 8C:
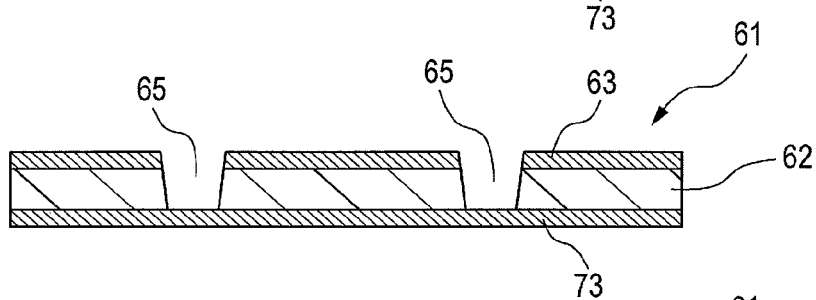

Subsequently, when laser processing is carried out by using the copper foil 63 provided with the laser opening 64 as a mask, as shown in FIG. 8C, a via-hole opening 65 is formed in the insulation material 62. Alternatively, the via-hole opening 65 may be formed in the insulation material 62 by directly performing the laser processing onto the copper foil 63.

Figure 8D:
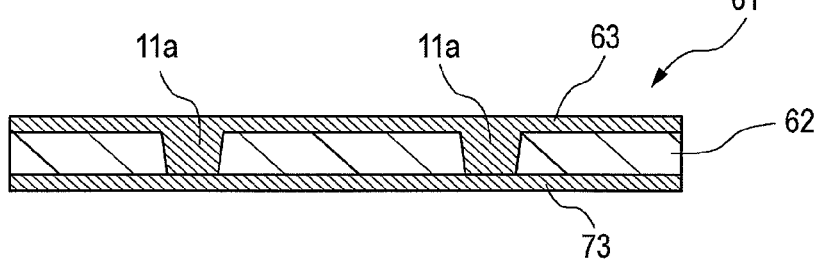

A seed layer (not shown) as a conductive path is formed on a surface of the copper foil 73 corresponding to the via-hole opening 65 by electroless copper plating. When the seed layer is formed, subsequently, electrolytic copper plating is carried out, and as shown in FIG. 8D, the via hole 11a is formed in the via-hole opening 65.

Subsequently, a photoresist made of photosensitive resin material is formed on both surfaces of the core material 61 provided with the via hole 11a by screen printing, photosensitive resin film laminating, or coating. Subsequently, patterning is carried out by performing an exposure in such a manner that a beam is irradiated to the photoresist via a mask pattern (not shown), and then the photoresist is removed at a region excluding the positions where wiring patterns 11b and the 21b are provided.

Figure 8E:
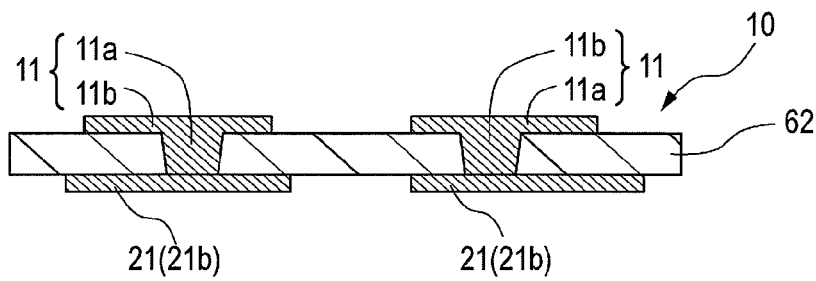

Subsequently, etching is performed to the copper foil 63 by using the patterned photoresist as a mask. Subsequently, when the photoresist is removed, as shown in FIG. 8E, the wiring layer 11 including the via hole 11a and the wiring pattern 11b is formed together with the wiring layer 21 including the wiring pattern 21b connected to the via hole 11a, thereby manufacturing the core layer 10 having an integral structure.

Figure 8F:
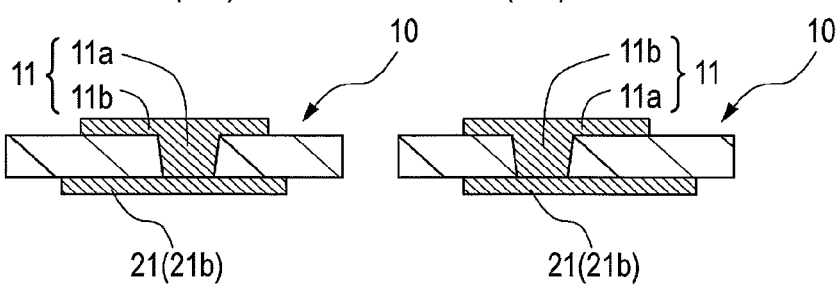

Subsequently, as shown in FIG. 8F, a process is carried out in which the core layer 10 having an integral structure is divided into a size corresponding to each electronic component mounting region or each electronic component mounting region group including a plurality of electronic component mounting regions. In this embodiment, the dividing process is carried out in terms of punching, but may be carried out in terms of cutting.

Subsequently, a process will be described which manufactures the wiring substrate 1 having a multi-layer structure in which a plurality of wiring layers and insulating layers are laminated on both surfaces of the core layer 10 divided as described above.

Figure 9A:
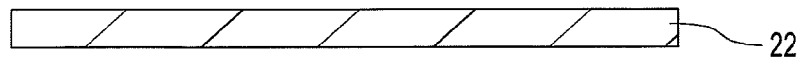
FIGS. 9A to 9E are explanatory views illustrating the method of manufacturing the wiring substrate according to the exemplary embodiment of the present invention.
Figure 10:
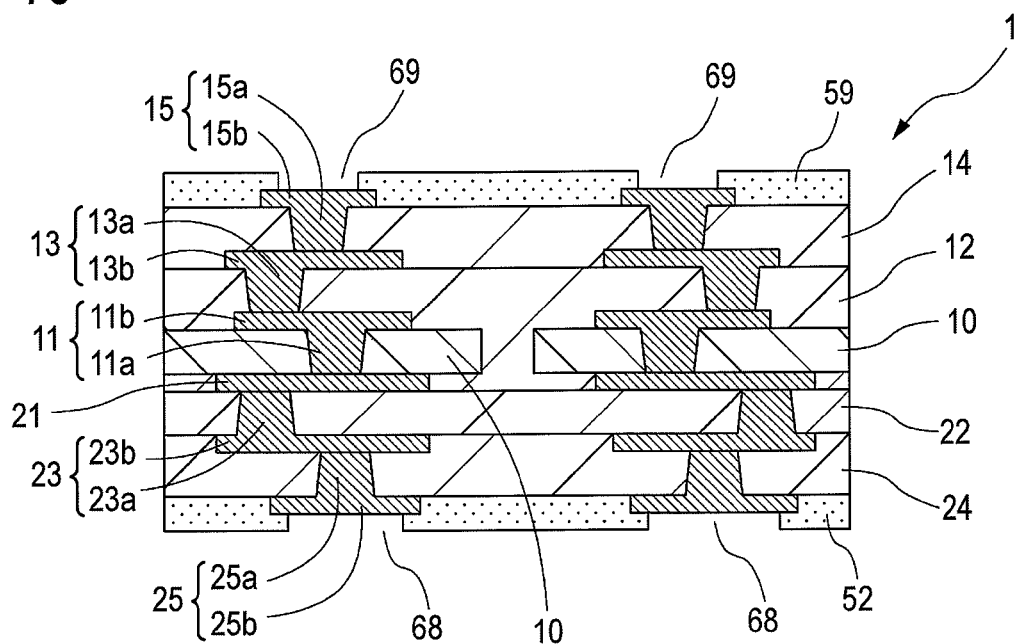
FIG. 10 is a schematic view showing the wiring substrate manufactured by the method.
Figure 11:
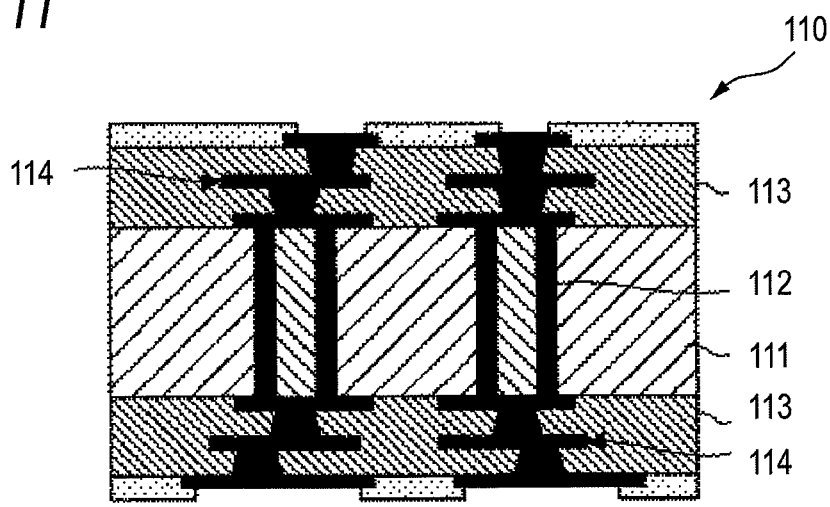
FIG. 11 is a schematic view showing the related-art wiring substrate.

First, as shown in FIG. 9A, the insulating layer 22 (first insulating layer) having one sheet shape such as resin film is prepared. Additionally, as described above, the insulating layer 22 is formed of epoxy-based buildup resin material having a thermosetting property.

Figure 9B:
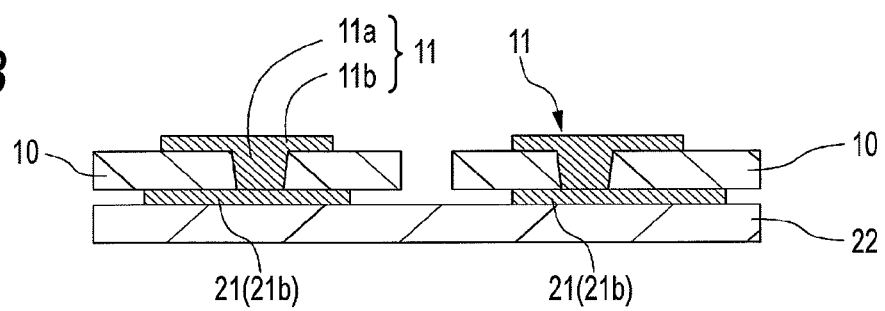

Next, as shown in FIG. 9B, the divided core layers 10 are placed at a certain position of the upper surface of the insulating layer 22. At this time, if necessary, the core layer 10 may be adhered to the insulating layer 22. As a method of placing the core layer 10, for example, a method may be supposed that positioning and placing operations are carried out in the same manner as a method of mounting electronic components to the wiring substrate.

Figure 9C:
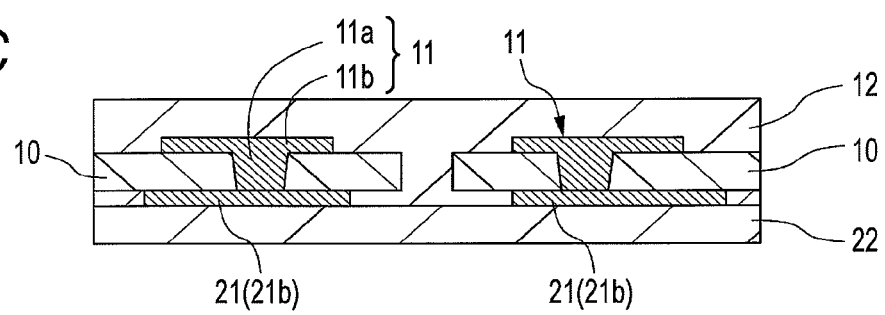

Next, as shown in FIG. 9C, the insulating layer 12 (second insulating layer) is formed so as to cover the core layer 10 and the gap 9 formed in the core layer 10 in a state where the divided core layers 10 are placed or adhered onto the insulating layer 22. As an example, the insulating layer 12 (buildup layer) is formed on the upper surface of the core layer 10 in terms of thermosetting epoxy resin coating or resin film laminating.

Subsequently, the wiring layer 23 is formed on the insulating layer 22 and the wiring layer 13 is formed on the insulating layer 12. Additionally, the following process is only an example of a manufacturing method. For example, it is possible to, of course, carry out the method of manufacturing the above-described core layer, that is, the copper foil etching or the like in the same manner as described above.

Additionally, in the following process, a process is integrally performed on the upper and lower layers with the core layer 10 interposed therebetween.

Figure 9D:
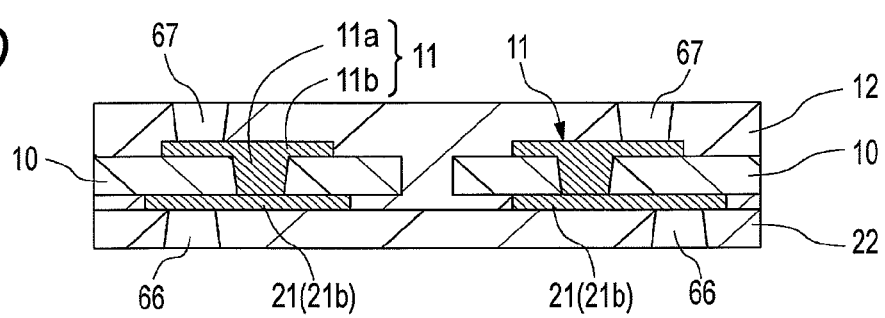

As shown in FIG. 9D, a via-hole opening 66 is formed in a portion of the insulating layer 22 corresponding to a region in which a via hole 23a is to be formed, and a via-hole opening 67 is formed in a portion of the insulating layer 12 corresponding to a region in which a via hole 13a is to be formed in terms of laser processing.

Next, the wiring layers 23 and 13 are formed on the insulating layers 22 and 12, respectively, through plating. That is, the via holes 23a and 13a are formed in the via-hole openings 66 and 67 of the insulating layers 22 and 12, respectively, and wiring patterns 23b and 13b are formed on the outermost surfaces of the insulating layers 22 and 12, respectively. At this time, the wiring patterns 23b and 13b are integrally connected to the via holes 23a and 13a, thereby forming the wiring layers 23 and 13.

Figure 9E:
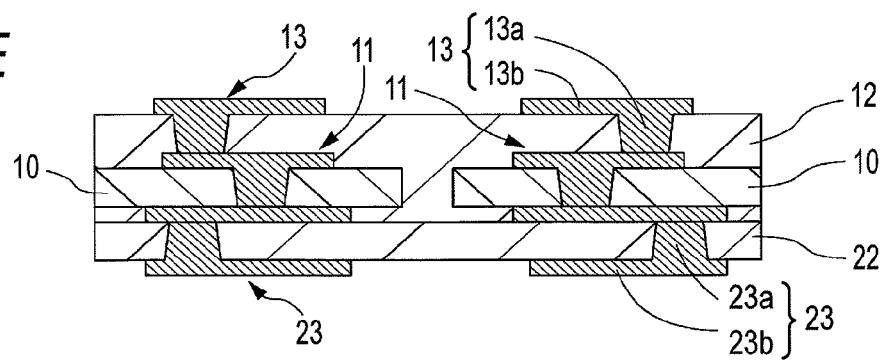

Specifically, the seed layers are formed on the outermost surfaces of the insulating layers 22 and 12 through electroless plating. Subsequently, resist patterns (not shown) respectively corresponding to the wiring patterns 11b and 21b are formed in terms of photolithography. Subsequently, copper (Cu) is deposited through electro plating with using the resist patterns as the masks. Subsequently, the resist pattern and the unnecessary seed layer are removed. Accordingly, as shown in FIG. 9E, the wiring layer 23 including the via hole 23a and the wiring pattern 23b and the wiring layer 13 including the via hole 13a and the wiring pattern 13b are formed.

As described above, when the insulating layers 22 and 12 and the wiring layers 23 and 13 are formed, subsequently, insulating layers 24 and 14 and wiring layers 25 and 15 are formed. Since the insulating layers 24 and 14 and the wiring layers 25 and 15 are formed in the same manner as that of the insulating layers 22 and 12 and the wiring layers 23 and 13, the description thereof will be omitted herein.

Subsequently, the solder resists 52 and 59 are formed on the insulating layers 24 and 14 in terms of screen printing or the like. Subsequently, patterning is carried out by performing an exposure in such a manner that a beam is irradiated to the solder resists 52 and 59 via a mask pattern (not shown), thereby forming openings 68 and 69. The wiring patterns 25b and 15b are respectively opposed to positions where the openings 68 and 69 are formed. Accordingly, in a state where the solder resists 52 and 59 are formed, the wiring patterns 25b and 15b are exposed from the openings 68 and 69, respectively. Additionally, the solder resists 52 and 59 each having the openings 68 and 69 may be formed by printing thermosetting resin material such as epoxy in terms of screen printing.

By performing the series of the processes, the wiring substrate 1 shown in FIG. 10 is manufactured.

Next, a process will be described which forms the groove portion 31 in the wiring substrate 1. As an example, it is possible to form the groove portion 31 in the surface layer 3 of the wiring substrate 1 by performing so-called half-dicing in which the wiring substrate 1 shown in FIG. 10 is cut up to a certain position by the use of a dicing device.

As another example, it is possible to form the groove portion 31 in the surface layer 3 of the wiring substrate 1 by performing the method of forming the opening on the solder resist in the same manner as described above.

In this manner, the wiring substrate 1 provided with the groove portion 31 shown in FIG. 3 is manufactured.

Further, a process will be described in which the notch portion 33 of the wiring substrate 1 is manufactured. As an example, it is possible to form the notch portion 33 in the wiring substrate 1 by performing the dicing so that the wiring substrate 1 shown in FIG. 10 is cut from the outer-peripheral edge portion up to a certain position. That is, it is possible to form the notch portion along the gap 9 in a direction perpendicular to the outer-peripheral edge of the wiring substrate 1 generally formed in a rectangular shape. Meanwhile, in a case where the hole portion 35 is formed in the wiring substrate 1, as an example, it is possible to form the hole portion 35 in the wiring substrate 1 by drilling a certain position of the wiring substrate 1 shown in FIG. 10 by the use of a drilling device. In this manner, the wiring substrate 1 provided with at least one of the notch portion 33 and the hole portion 35 shown in FIG. 5 is manufactured.

Additionally, in the method of manufacturing the multilayer wiring substrate 1, a case has been described in which one wiring substrate 1 is manufactured from the two separate core layers 10 which are adjacent to each other, but actually it is possible to obtain a plurality of wiring substrates 1. That is, it is possible to form the individual wiring substrate 1 in such a manner that a plurality of the wiring substrates 1 is formed on a plurality of the separate core layers 10 which are adjacent to each other, and the plurality of wiring substrates 10 is divided into pieces. Accordingly, it is possible to improve efficiency in the manufacturing process.

As described above, in the wiring substrate and the method of manufacturing the wiring substrate according to exemplary embodiment of the present invention, it is possible to prevent the wiring substrate from being bent or to remarkably reduce the deformation amount thereof. As a result, in a process in which the electronic component is mounted on the wiring substrate, it is possible to prevent errors caused by the deformation of the wiring substrate in the carrying operation and the mounting operation.

Additionally, while the multilayer wiring substrate is particularly exemplified in which deformation such as warpage is easily generated, exemplary embodiments of the invention are not limited thereto, but may be applied to different types of wiring substrates.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A wiring substrate comprising:
   a core layer in which a gap is formed; and
   a lamination layer which includes an insulating layer and a wiring layer and which is formed on at least one surface of the core layer, the lamination layer having a thermal expansion coefficient different from that of the core layer, wherein a plurality of mounting regions on which an electronic component is to be mounted are provided on the lamination layer to be spaced from each other,
   wherein the gap in the core layer is filled with an insulating member having the same material as the insulating layer and surrounds each of the plurality of mounting regions or each of mounting region groups including one or more of the mounting regions.

2. The wiring substrate according to claim 1, wherein a groove portion is provided in the lamination layer to correspond to the insulating member.

3. The wiring substrate according to claim 1, wherein at least one of a notch portion and a hole portion is formed through the insulating member and the lamination layer.

4. The wiring substrate according to claim 1, wherein the lamination layer is formed on both surfaces of the core layer.

5. The wiring substrate according to claim 1, wherein the core layer is formed of prepreg material and the insulating layer is formed of resin material.

6. A semiconductor device comprising:
   the wiring substrate according to claim 1; and
   an electronic component mounted on the mounting regions.

7. A method of manufacturing a wiring substrate, the method comprising:
   (a) providing a core layer which includes: a plate member; through-vias formed in the plate member; and wiring patterns formed on the plate member and each connected to a corresponding one of the through-vias;
   (b) forming a gap in the core layer such that the gap surrounds each of the wiring patterns or each of wiring pattern groups including one or more of the wiring patterns;
   (c) disposing the core layer on an insulation-member having a thermal expansion coefficient different from that of the plate member;
   (d) forming an insulating layer so as to cover the core layer and fill the gap; and
   (e) forming a wiring layer on the insulating layer, thereby forming a lamination layer, which includes the insulating layer and the wiring layer, on the core layer.

8. The method according to claim 7, further comprising:
   (f) forming a groove portion in the lamination layer so as to correspond to a forming region of the gap.

9. The method according to claim 7, further comprising:
   (g) forming at least one of a notch portion and a hole portion so as to correspond to a forming region of the gap.

* * * * *